(12) United States Patent
Shin et al.

(10) Patent No.: US 7,871,897 B2
(45) Date of Patent: Jan. 18, 2011

(54) METHOD OF FORMING SHALLOW TRENCH ISOLATION REGIONS IN DEVICES WITH NMOS AND PMOS REGIONS

(75) Inventors: Dong-woon Shin, Gyeonggi-do (KR); Soo-jin Hong, Gyeonggi-do (KR); Guk-hyon Yon, Gyeonggi-do (KR); Si-young Choi, Gyeonggi-do (KR); Sun-ghil Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/466,178

(22) Filed: May 14, 2009

(65) Prior Publication Data
US 2009/0311846 A1    Dec. 17, 2009

(30) Foreign Application Priority Data
Jun. 11, 2008    (KR) ...................... 10-2008-0054860

(51) Int. Cl.
*H01L 21/762* (2006.01)
(52) U.S. Cl. .................. 438/435; 438/424; 438/426; 257/E21.546
(58) Field of Classification Search .......... 257/118, 257/244, 328–333, 466, 513, 594; 438/242, 438/268–274, 424, 435
See application file for complete search history.

(56) References Cited

U.S. PATENT DOCUMENTS 7,033,907 B2 *   4/2006   Kim ........................... 438/425
2008/0138958 A1 *  6/2008  Lee ........................... 438/426
2009/0256233 A1 * 10/2009  Eun ........................... 257/510

FOREIGN PATENT DOCUMENTS

JP    2004 063591     2/2004
JP    2006 286889     10/2006
KR    1020070058116 A  6/2007

* cited by examiner

*Primary Examiner*—Fernando L Toledo
*Assistant Examiner*—Mamadou Diallo
(74) *Attorney, Agent, or Firm*—Myers Bigel Sibley & Sajovec, P.A.

(57) ABSTRACT

A mask pattern is formed on a semiconductor substrate in which a cell region, a PMOS region, and an NMOS region are defined. Trenches are formed in the cell region, the PMOS region, and the NMOS region. A sidewall oxide layer and a protection layer are formed in the trenches, and a portion of the protection layer in the PMOS region is removed. A first device isolation insulating layer is formed on the substrate, filling the trenches. Portions of the first device isolation insulating layer are removed to expose the mask pattern and the trenches of the cell region and the NMOS region and to leave a portion of the first device isolation insulating layer in the trench in the PMOS region. A liner is formed on the portion of the first device isolation region in the trench in the PMOS region and conforming to sidewalls of the trenches in the cell region and the NMOS region. A second device isolation insulating layer is formed on the substrate, filling the trenches in the cell region and the NMOS region. Portions of the second device isolation insulating layer are removed to expose the mask pattern and to leave portions of the second device isolation insulating layer in the trenches of the cell region and the NMOS region.

20 Claims, 9 Drawing Sheets

METHOD OF FORMING SHALLOW TRENCH ISOLATION REGIONS IN DEVICES WITH NMOS AND PMOS REGIONS

CROSS-REFERENCE TO RELATED APPLICATION

This application claims the benefit of Korean Patent Application No. 10-2008-0054860, filed on Jun. 11, 2008, in the Korean Intellectual Property Office, the disclosure of which is incorporated herein in its entirety by reference.

BACKGROUND

The present invention relates to methods of forming semiconductor devices, and more particularly, to methods of forming device isolation layers using STI (shallow trench isolation).

Conventionally, in order to electrically separate devices in a semiconductor chip, an STI (shallow trench isolation) process in which trenches are formed in a semiconductor substrate and buried with an insulating layer is widely used. FIG. 1 is a cross-sectional view illustrating a conventional STI device isolation layer. Referring to FIG. 1, a sidewall oxide layer 22 and a liner nitride film 24 are formed on sidewalls of a trench 15 of a semiconductor substrate 10 in a cell region, an NMOS region, and a PMOS region, and the trench 15 is buried by a device isolation insulation layer 30 on the liner nitride film 24.

The liner nitride film 24 may improve the refresh characteristics of a cell by reducing stress of the semiconductor device and preventing diffusion of doping elements such as boron. A silicon oxide layer used as the device isolation insulating layer 30 has a tensile stress, and thus a channel of an active region surrounded by the device isolation insulating layer 30 receives a compression stress. In particular, when an NMOS device receives a compression stress, electron mobility may be decreased, which may cause a decrease in the speed of the device. The liner nitride film 24 may reduce stress applied by the device isolation isolating layer 30 to the NMOS device.

However, in the case of a PMOS device, as illustrated in FIG. 2, after a transistor 40 is turned on, EHP (electron hole pairs), which are hot carriers, are created, and electrons $e^-$ of the EHP may be trapped in the liner nitride film 24. Accordingly, HEIP (hot electron induced punch through), i.e., a punch through caused by the electrons $e^-$ trapped in the liner nitride film 24, may occur. Holes $h^+$ may be induced at a channel edge of the active region by the electrons $e^-$ trapped in the liner nitride film 24, which may cause deterioration of off characteristics of the device, for example, may increase currents when the transistor 40 is turned off.

SUMMARY

Some embodiments of the present invention provide methods for forming device isolation structures in a semiconductor device. A mask pattern is formed on a semiconductor substrate in which a cell region, a PMOS region, and an NMOS region are defined. Respective trenches are formed in the cell region, the PMOS region, and the NMOS region by etching the semiconductor substrate using the mask pattern as a mask. A sidewall oxide layer and a protection layer are sequentially formed in the trenches. The protection layer in the PMOS region is removed. A first device isolation insulating layer is formed on the substrate, filling the trenches. Portions of the first device isolation insulating layer are removed to expose the mask pattern and the trenches of the cell region and the NMOS region and to leave a portion of the first device isolation insulating layer in the trench in the PMOS region. A silicon nitride layer is formed on the substrate to form a liner disposed on the portion of the first device isolation region in the trench in the PMOS region and conforming to sidewalls of the trenches in the cell region and the NMOS region. A second device isolation insulating layer is formed on the substrate, filling the trenches in the cell region and the NMOS region. Portions of the second device isolation insulating layer are removed to expose the mask pattern and to leave portions of the second device isolation insulating layer in the trenches of the cell region and the NMOS region.

Forming the mask pattern may include forming a pad oxide layer on the semiconductor substrate, forming a mask silicon nitride layer on the pad oxide layer, forming a photoresist pattern on the silicon nitride layer and etching the mask silicon nitride layer using the photoresist pattern as a mask. The sidewall oxide layer may include a thermal oxide layer, a rapid thermal oxidation (RTO) oxide layer or a chemical vapor deposition (CVD) oxide layer. The protection layer may include a silicon layer, for example, epitaxial silicon, polycrystalline silicon and/or amorphous silicon. The first device isolation insulating layer may include a high density plasma (HDP) oxide layer or an undoped silicate glass (USG) oxide layer.

Removing portions of the first device isolation insulating layer to expose the mask pattern and the trenches of the cell region and the NMOS region and leave a portion of the first device isolation insulating layer in the trench in the PMOS region may include chemically mechanically polishing the first device isolation insulating layer using the mask pattern as a stopper layer. Removing portions of the first device isolation insulating layer to expose the mask pattern and the trenches of the cell region and the NMOS region and leave a portion of the first device isolation insulating layer in the trench in the PMOS region may further include wet etching to remove portions of the first device isolation insulation layer in the trenches of the cell region and the NMOS region. The silicon nitride layer may be formed over the sidewall oxide layer in the trenches in the cell region and the NMOS region, and over the mask pattern and the first device isolation insulating layer in the PMOS region.

Removing portions of the second device isolation insulating layer to expose the mask pattern and to leave portions of the second device isolation insulating layer in the trenches of the cell region and the NMOS region may include chemical mechanical polishing the second device isolation insulating layer using the mask pattern as a stopper layer. The second device isolation insulating layer may include a SOG layer, e.g., a TOSZ layer. Forming a second device isolation insulating layer may include spin-coating a SOG layer, baking the spin-coated SOG layer and annealing the baked SOG layer. Annealing of the baked SOG layer may be performed in an atmosphere containing $H_2O$.

In further embodiments, methods of forming device isolation structures include forming a mask pattern on a semiconductor substrate in which a cell region, a PMOS region, and an NMOS region are defined and forming respective trenches in the cell region, the PMOS region, and the NMOS region by etching the semiconductor substrate using the mask pattern as a mask. A sidewall oxide layer is formed in the trench. A first device isolation insulating layer is formed on the substrate, filling the trenches. Portions of the first device isolation insulating layer are removed to expose the mask pattern and the trenches of the cell region and the NMOS region and leave a portion of the first device isolation insulating layer in the trench in the PMOS region. A silicon nitride layer is formed on the substrate to form a liner disposed on the portion of the first device isolation region in the trench in the PMOS region and conforming to sidewalls of the trenches in the cell region and the NMOS region. A second device isolation insulating layer is formed on the substrate, filling the trenches in the cell region and the NMOS region, and portions of the second device isolation insulating layer are removed to expose the mask pattern and to leave portions of the second device isolation insulating layer in the trenches of the cell region and the NMOS region. The mask patterns are removed.

The first device isolation insulating layer may include an HDP oxide layer or a USG oxide layer. Removing portions of the first device isolation insulating layer may include anisotropic etching with a high selectivity with respect to the mask pattern. The second device isolation insulating layer may include a SOG layer, e.g., a TOSZ layer.

BRIEF DESCRIPTION OF THE DRAWINGS

Exemplary embodiments of the present invention will be more clearly understood from the following detailed description taken in conjunction with the accompanying drawings.

DETAILED DESCRIPTION OF EMBODIMENTS

Figure 1:
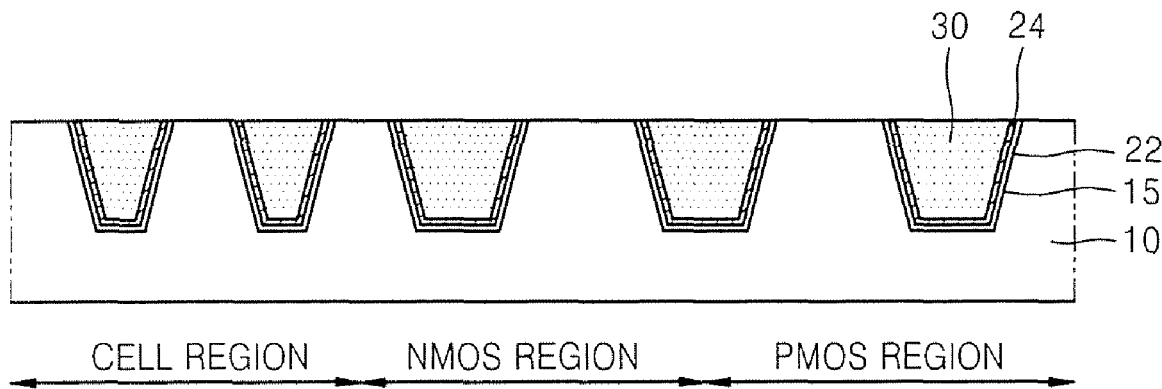
FIG. 1 is a cross-sectional view illustrating a conventional STI (shallow trench isolation) device isolation layer.
Figure 2:
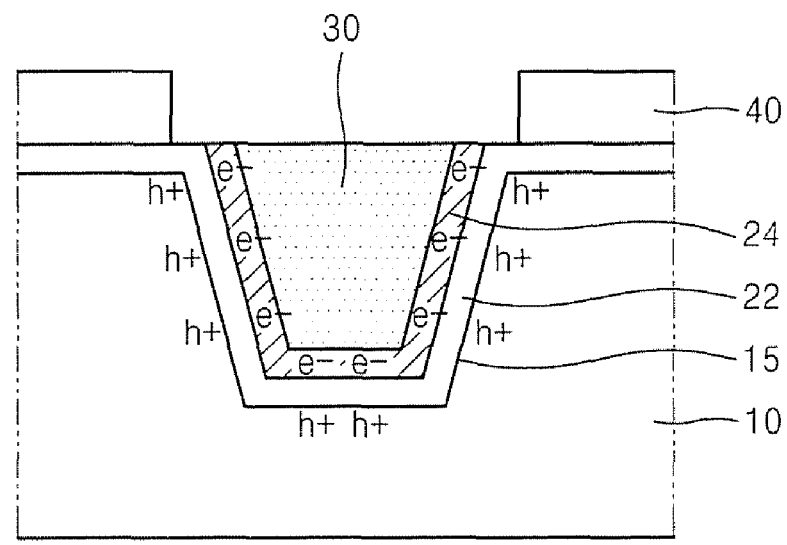
FIG. 2 illustrates holes being gathered at edges of an active region of a PMOS region as electrons are trapped in a liner nitride film.
Figure 3:
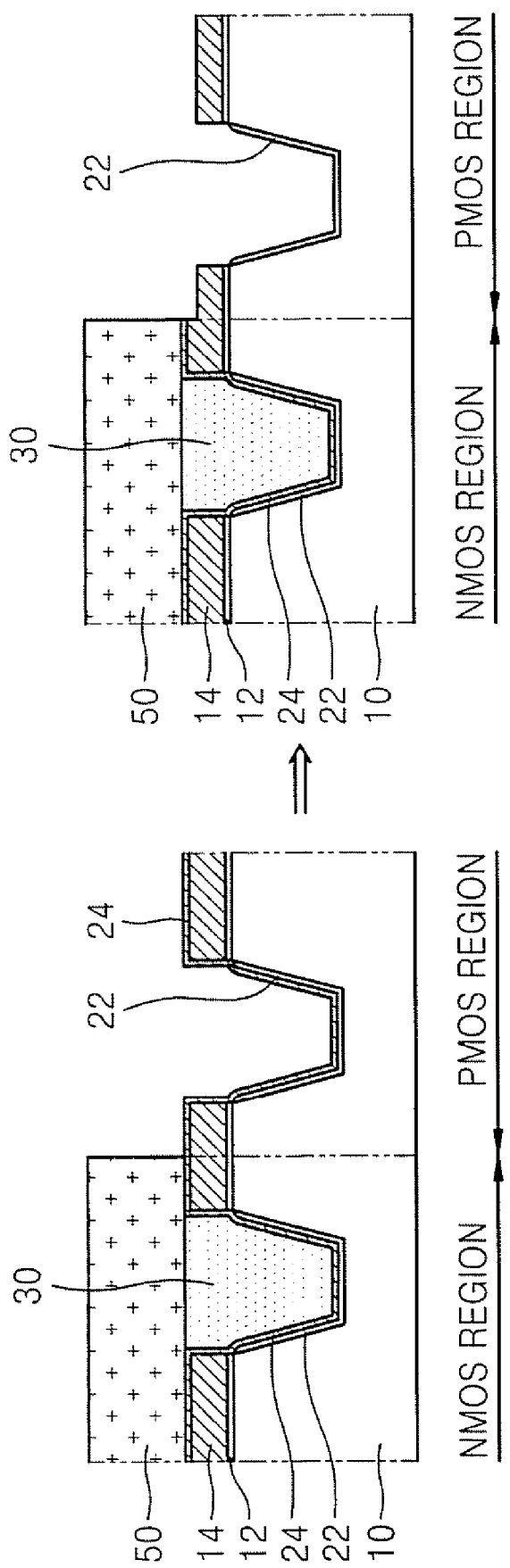
FIG. 3 illustrates a process involving removal of a liner nitride film of a PMOS region when forming a conventional STI device isolation layer.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being on, connected to and/or coupled to another element or layer, the element or layer may be directly on, connected and/or coupled to the other element or layer, or intervening elements or layers may be present. In contrast, when an element is referred to as being directly on, directly connected to and/or directly coupled to another element or layer, no intervening elements or layers are present. As used herein, the term "and/or" includes any and all combinations of one or more of the associated listed items.

It will also be understood that, although the terms first, second, etc., may be used herein to describe various elements, components, regions, layers and/or sections, these elements, components, regions, layers and/or sections should not be limited by these terms. Rather, these terms are used merely as a convenience to distinguish one element, component, region, layer and/or section from another element, component, region, layer and/or section. For example, a first element, component, region, layer and/or section could be termed a second element, component, region, layer and/or section without departing from the teachings of the present invention.

Spatially relative terms, such as beneath, below, lower, above, upper, "top," "bottom" and the like, may be used to describe an element and/or features relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly. As used herein, "height" refers to a direction that is generally orthogonal to the faces of a substrate.

The terminology used herein is for the purpose of describing particular embodiments only and is not intended to limit the invention. As used herein, the singular terms a, an and the are intended to include the plural forms as well, unless the context clearly indicates otherwise. It will be further understood that the terms "comprise," "comprising," includes, including, "have", "having" and variants thereof specify the presence of stated features, integers, steps, operations, elements, and/or components, but do not preclude the presence and/or addition of one or more other features, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention. Like reference numerals refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

In the drawings, the thickness of layers and regions are exaggerated for clarity. It will also be understood that when an element such as a layer, region or substrate is referred to as being ìonî or ìontoî another element, it may lie directly on the other element or intervening elements or layers may also be present. Like reference numerals refer to like elements throughout the specification.

FIGS. 4A through 4J are cross-sectional views illustrating operations for forming a device isolation layer of a semiconductor device according to some embodiments of the present invention. In FIGS. 4A through 4J, a cell region, an NMOS region, and a PMOS region are illustrated side by side. The NMOS region and the PMOS region are illustrated as being connected to each other in order to describe formation of a liner nitride film.

Figure 4A:
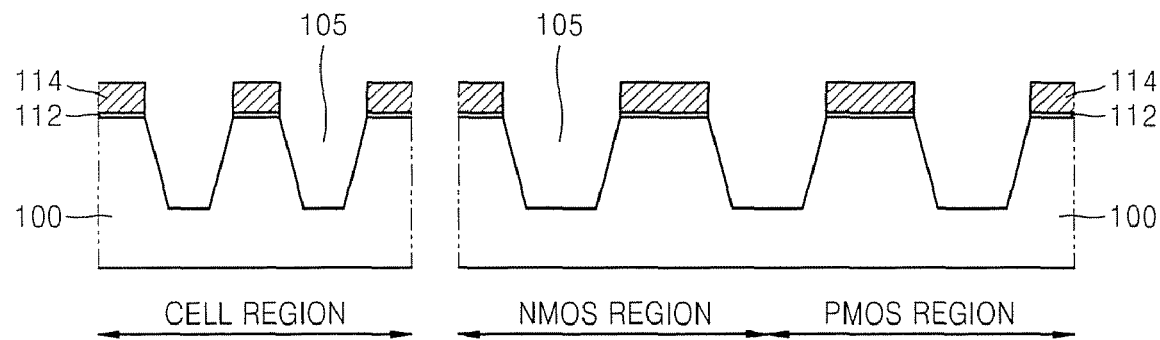
FIGS. 4A through 4J are cross-sectional views illustrating operations for forming a device isolation layer of a semiconductor device according to some embodiments of the present invention.

Referring to FIG. 4A, a pad oxide layer 112 and a silicon nitride layer 114 are formed and patterned on a semiconductor substrate 100 in which a cell region, a PMOS region, and an NMOS region are defined, to form a nitride layer mask 114. The semiconductor substrate 100 is etched using the nitride layer mask 114 as a mask to form a trench 105 for device isolation in each of the cell region, the PMOS region, and the NMOS region.

Figure 4B:
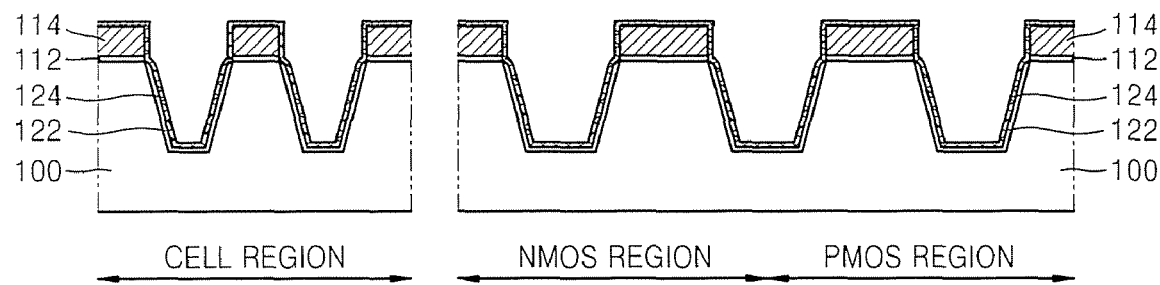

Referring to FIG. 4B, a sidewall oxide layer 122 and a protection layer 124 are formed over the trenches 105. The sidewall oxide layer 122 cures etching damage caused on sidewalls of the trench 105 when etching the trench 105. Examples of the sidewall oxide layer 122 include a thermal oxide layer, a RTO (rapid thermal oxidation) layer, and a CVD (chemical vapor deposition) oxide layer. The protection layer 124 may be formed of a layer having etching selectivity with respect to a silicon oxide layer and a silicon nitride layer. For example, the protection layer 124 may be formed of epitaxial silicon, polycrystalline silicon, or amorphous silicon.

Figure 4C:
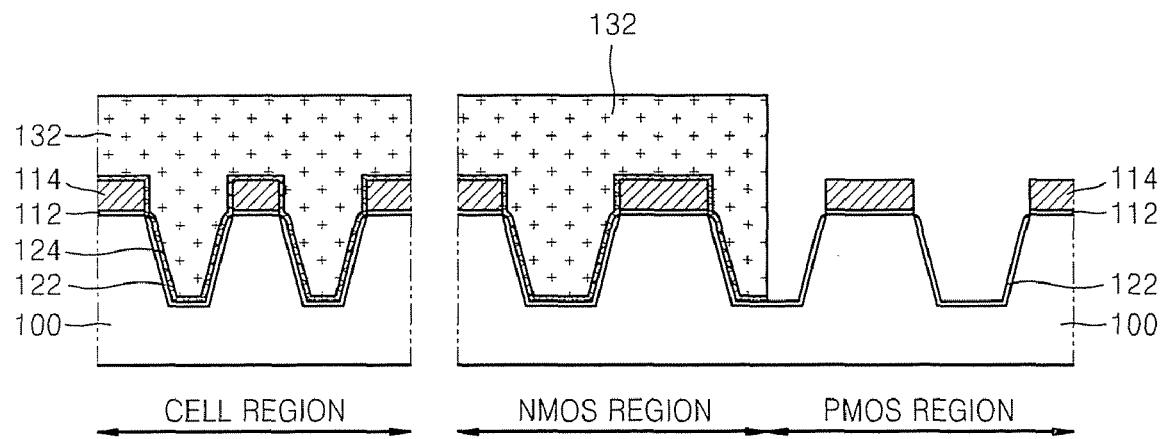

Referring to FIG. 4C, the cell region and the NMOS region are covered with a photoresist 132 and the protection layer 124 in the exposed PMOS region is removed. When the protection layer 124 is a silicon layer, the protection layer 124 can be etched by wet etching having a selectivity to a silicon nitride layer. When the photoresist 132 is removed, the protection layer 124 is formed over the sidewall oxide layer 122 in the trenches 105 of the cell region and the NMOS region, and the sidewall oxide layer 122 is formed in the trench 105 of the PMOS region.

Figure 4D:
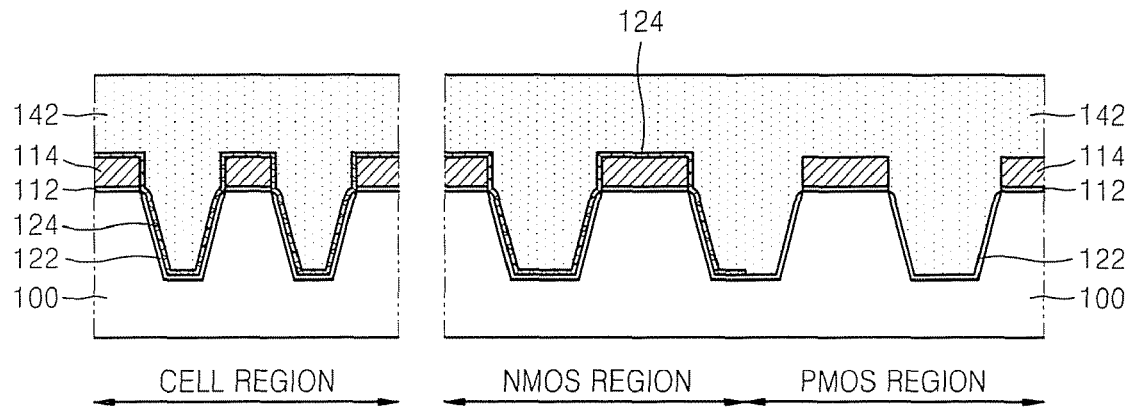

Referring to FIG. 4D, a first device isolation insulating layer 142 is formed on the semiconductor substrate 100 so as to fill the trenches 105. The first device isolation insulating layer 142 may be, for example, an HDP (high density plasma) oxide layer or a USG (undoped silicate glass) oxide layer. In the cell region, an HDP oxide layer or a USG oxide layer may not completely fill the narrow trench 105, but since the HDP oxide layer or the USG oxide layer will be removed later, this may not be a problem. The material used for the first device isolation insulating layer 142 is not limited to the above examples.

Figure 4E:
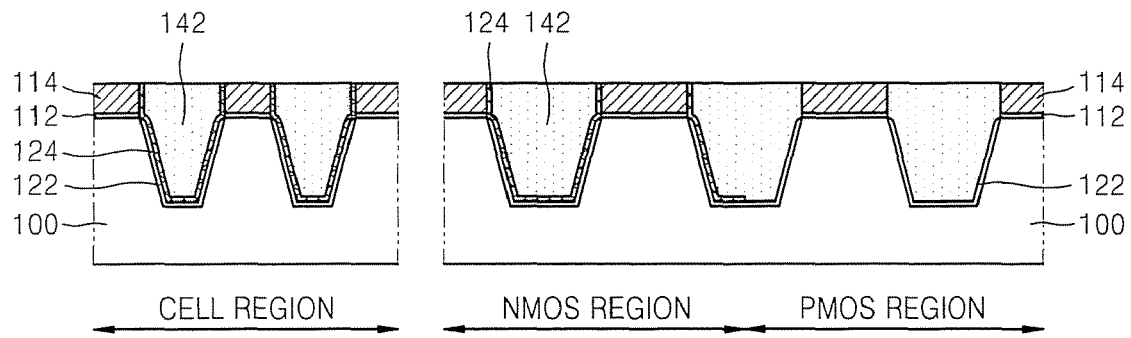

Referring to FIG. 4E, by using the nitride layer mask 114 as a stopper layer, the first device isolation insulating layer 142 is chemically mechanically polished to form a device isolation region 142 in each of the cell region, the NMOS region, and the PMOS region. As illustrated in FIG. 4E, the trenches of the cell region, the NMOS region, and the PMOS region are filled with the insulating regions 142 without a liner nitride film. Since the trenches may be filled with an HDP oxide layer or a USG oxide layer which does not require a high temperature $H_2O$ annealing process, an active region may not be oxidized in a region free of a liner nitride film by the high temperature $H_2O$ annealing process, unlike the case when the trench is formed of a SOG (spin on glass) oxide layer.

Figure 4F:
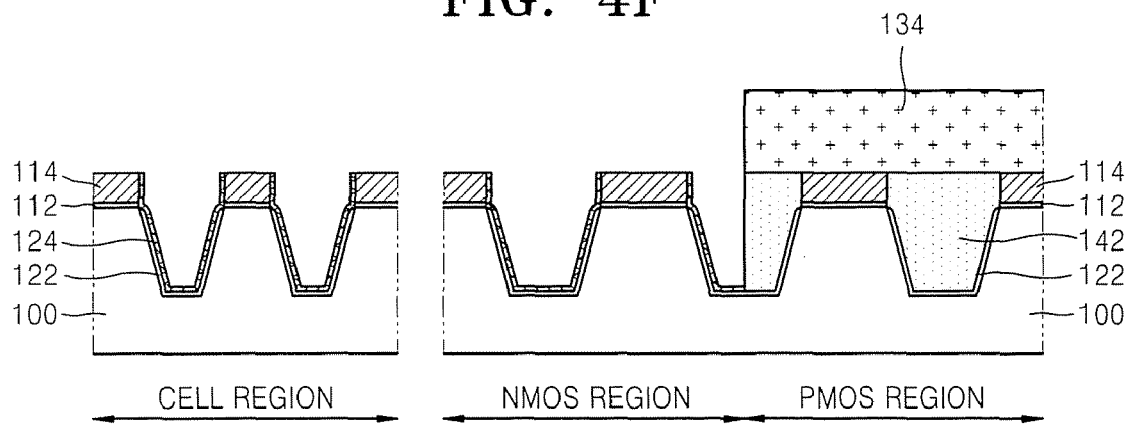

Referring to FIG. 4F, the PMOS region is covered with a photoresist 134 and the first device isolation insulation layer 142 of the cell region and the NMOS region is removed. Instead of a photoresist, a hard mask layer formed of a material having an etching selectivity to a silicon oxide layer and a silicon nitride layer may be used. In order that the exposed nitride layer mask 114 is not lost while the first device isolation insulation layer 142 is being removed, the first device isolation insulating layer 142 may be removed under a condition where the etching selectivity to a nitride layer is high. For example, the first device isolation insulating layer 142 may be removed by wet etching. Since the nitride layer mask 114 of the cell region and the NMOS region is not significantly damaged when the first device isolation insulating layer 142 is removed, the height of the nitride layer mask 114 of the cell region and the NMOS region and the height of the nitride layer mask 114 of the PMOS region are not substantially changed. If the height of the nitride layer mask 114 is not uniform, a CMP process may not be performed uniformly, and the height of the device isolation insulating layer that protrudes over the semiconductor substrate 100 after the nitride layer mask 114 is removed may change, and this may affect subsequent processes and degrade the characteristics of the semiconductor device.

When the photoresist 134 is removed, the protection layer 124 is exposed in the trenches 105 of the cell region and the NMOS region, from which the first device isolation insulating layer 142 is removed. The protection layer 124 functions as an etching prevention layer when removing the first device isolation insulating layer 142 of the cell region and the NMOS region. If the protection layer 124 is not present when removing the first device isolation insulating layer 142 by wet etching, the pad oxide layer 112 may be etched from the edge by isotropic etching of the wet etching. When the pad oxide layer 112 is etched, the nitride layer mask 114 may be separated off from the semiconductor substrate, and the protection layer 124 can prevent this separation.

Figure 4G:
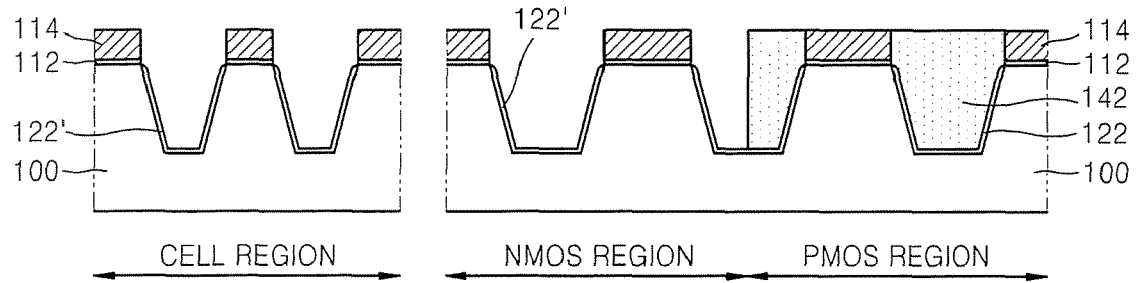

Referring to FIG. 4G, the protection layer 124 is oxidized to form a silicon oxide layer. The oxidization of the protection layer 124 may be performed by dry oxidization or thermal oxidization. The oxidized protection layer 124 may form a sidewall oxide layer 122' from the previous sidewall oxide layer 122. In the operation of FIG. 4G, the sidewall oxide layer 122' is formed in the trenches 105 of the cell region and the NMOS region, and the first device isolation insulating layer 142 is disposed over the sidewall oxide layer 122 of the trench 105 of the PMOS region.

Figure 4H:
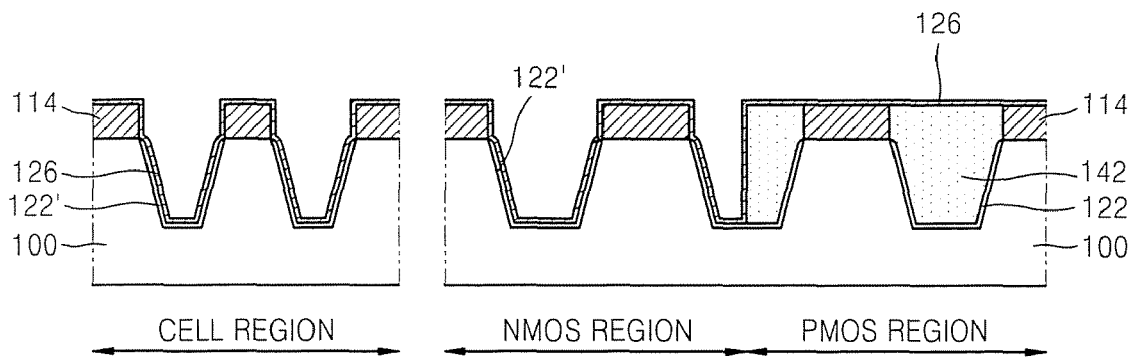

Referring to FIG. 4H, a silicon nitride layer 126 is formed on the semiconductor substrate 100. The silicon nitride layer 126 is disposed on the sidewall oxide layer 122' of the trenches 105 in the cell region and the NMOS region. In the PMOS region, the silicon nitride layer 126 is formed over the buried first device isolation insulating layer 142 and the nitride layer mask 114. The silicon nitride layer 126 functions as a liner nitride film in the cell region and the NMOS region, and functions as an oxidization-resistant layer when subsequently forming a SOG oxide layer in the PMOS region. In the PMOS region, oxidization of the sidewalls of the active region can be reduced or prevented by the silicon nitride layer 126 blocking vapor from passing through the first device isolation insulating layer 142 during a $H_2O$ annealing process of the SOG oxide layer.

Figure 4I:
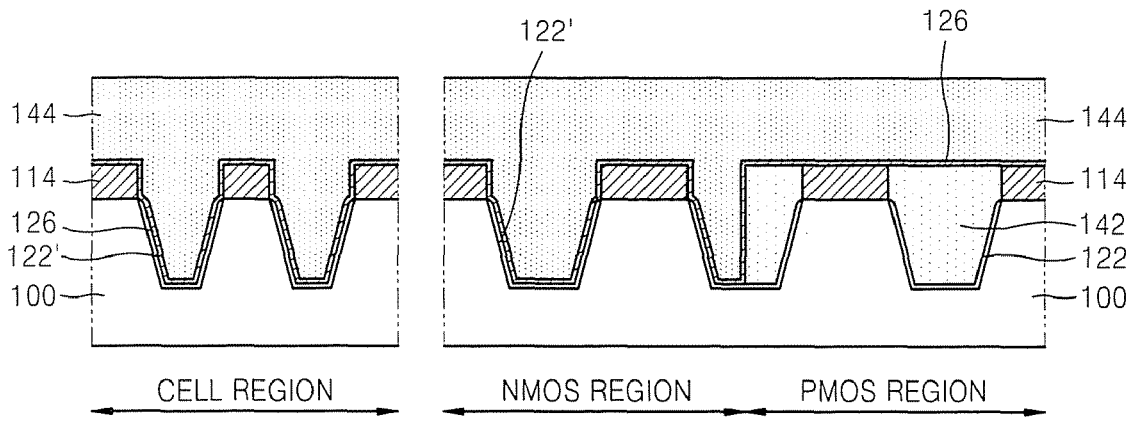

Referring to FIG. 4I, a second device isolation insulating layer 144 is formed on the semiconductor substrate 100, filling the trenches 105 of the cell region and the NMOS region. The second device isolation insulating layer 144 may be an SOG oxide layer, such as TOSZ. The SOG oxide layer may have excellent gap filling capability and thus can fill the relatively narrow trench in the cell region. The material of the second device isolation insulating layer 144 is not limited to the above-described material, and may be other materials suitable in view of the concept of the present invention. The SOG oxide layer may be formed using a spin coating method and hardened by baking and annealing. The second device isolation insulating layer 144 is annealed in a vapor atmosphere at high temperature. In the cell region and the NMOS region, the silicon nitride layer 126 on the sidewall of the trench may reduce or prevent oxidization of sidewalls of an active region and, in the PMOS region, the silicon nitride layer 126 formed over the first device isolation insulating layer 142 and the nitride layer mask 114 may reduce or prevent oxidization of sidewalls of the active region.

Figure 4J:
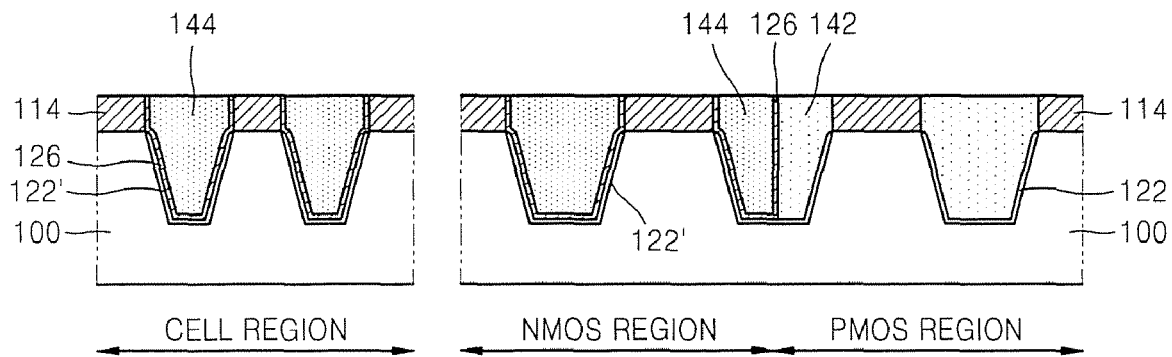

Referring to FIG. 4J, isolation regions are formed in the trench 105 from the second device isolation insulating layer 144 in the cell region and the NMOS region by using the nitride layer mask 114 as a stopper layer and chemical mechanical polishing the second device isolation insulating layer 144. In the illustrated embodiments of the present invention, when a liner nitride film is formed over the pad oxide 122' in the cell region and the NMOS region an oxidization-resistant nitride layer is also formed over the first device isolation insulating layer 142 in the PMOS region in the operation of FIG. 4I. Accordingly, there is no need to remove a liner nitride film in the PMOS region, thus, no substantial height difference of the nitride layer masks 114 in the NMOS region and in the PMOS region occurs due to etching the exposed nitride layer mask during etching a liner nitride film in PMOS region. Thus, the second device isolation insulating layer 144 can be uniformly chemical mechanical polished.

FIGS. 5A through 5E are cross-sectional views illustrating a method of forming a device isolation layer of a semiconductor device in the process sequence, according to further embodiments of the present invention. In FIGS. 5A through 5E, a cell region, an NMOS region, and a PMOS region are disposed side by side. The NMOS region and the PMOS region are connected to each other in order to illustrate formation of a liner nitride film. The illustrated embodiments are similar to the previously discussed embodiments, except that no protection layer is used.

Figure 5A:
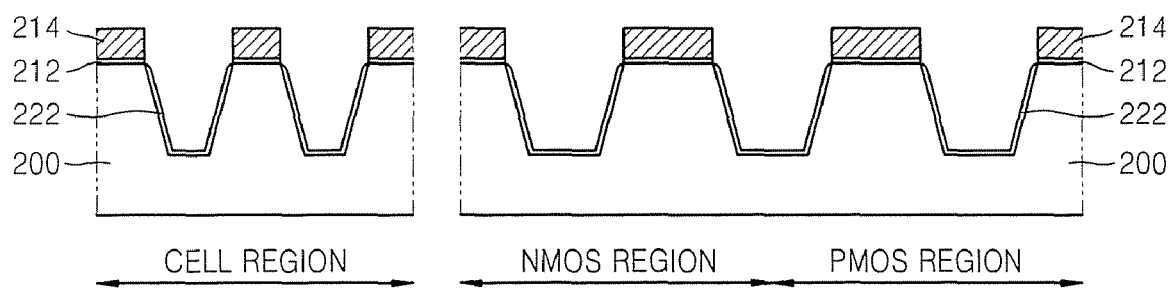
FIGS. 5A through 5E are cross-sectional views illustrating operations for forming a device isolation layer of a semiconductor device according to further embodiments of the present invention.

Referring to FIG. 5A, as in FIG. 4A, a pad oxide layer 212 and a silicon nitride layer 214 are formed and patterned on a semiconductor substrate 200 in which a cell region, a PMOS region, and an NMOS region are defined, to form a nitride layer mask 214. Then the nitride layer mask 214 is used as a mask to etch the semiconductor substrate 200 and form trenches 205 for device isolation in the cell region, the PMOS region, and the NMOS region. Sidewall oxide layers 222 are formed in the trenches 105.

Figure 5B:
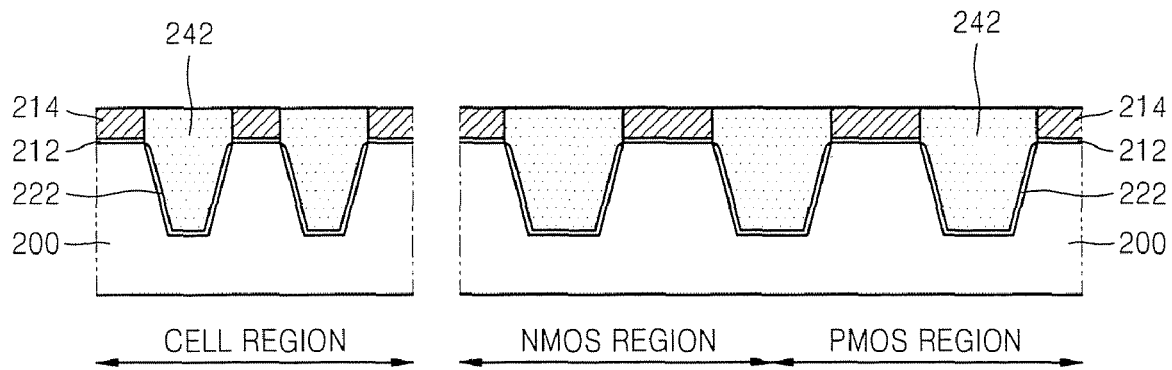

Referring to FIG. 5B, a first device isolation insulating layer 242 is formed on the substrate 220, filling the trenches 205. The nitride layer mask 214 is used as a stopper layer to CMP the first device isolation insulating layer 242 to form isolation regions in the trenches 205 of the cell region, the NMOS region, and the PMOS region from the insulating layer 242. The first device isolation insulating layer 242 may be, for example, an HDP oxide layer or a USG oxide layer. As illustrated in FIG. 5B, the isolation regions in the trenches 205 are formed free of a liner nitride film in the cell region, the NMOS region, and the PMOS region.

Figure 5C:
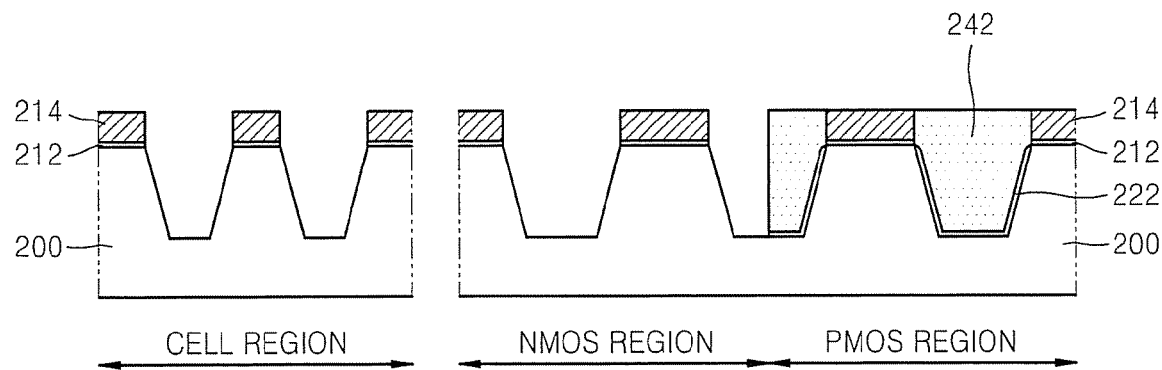

Referring to FIG. 5C, the PMOS region is covered with a photoresist (not shown) and the portions of the first device isolation insulating layer 242 in of the cell region and the NMOS region are removed. Instead of a photoresist, a hard mask layer formed of a material having an etching selectivity to a silicon oxide layer and a silicon nitride layer may be used. The first device isolation insulating layer 242 may be removed by anisotropic etching under a condition with a great etching selectivity to a silicon nitride layer. The sidewall oxide layers 222 can also be removed together with the first device isolation insulating layer 242 in the cell region and the NMOS region. Since the etching selectivity to a silicon nitride layer is high, the exposed nitride layer mask 214 is not significantly affected, and since anisotropic etching is used, the pad oxide layer 212 is not significantly attacked near the trench 205. Also, since the nitride layer mask 214 is not significantly etched, the height of the nitride layer mask 214 of the NMOS region and the height of the nitride layer mask 214 of the PMOS region remain substantially the same. Furthermore, since significant etching from a side of the pad oxide layer 212 does not occur, the nitride layer mask 214 is not separated from the substrate 200.

Figure 5D:
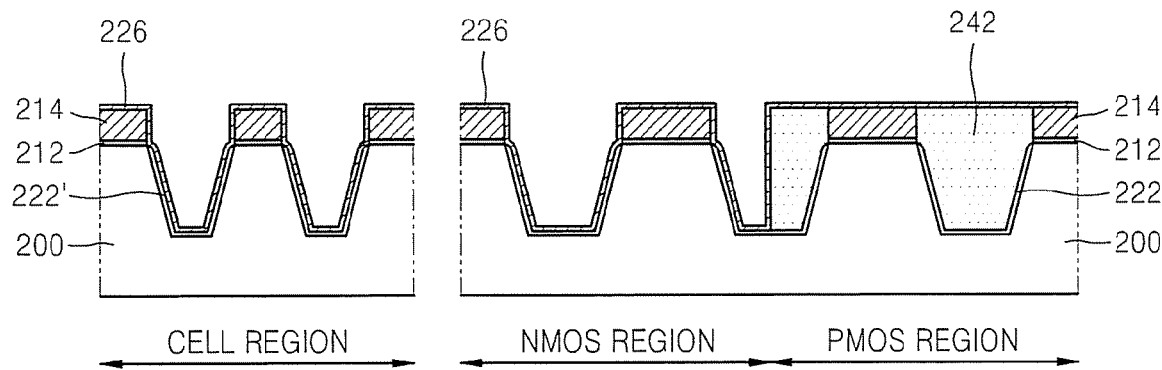

Referring to FIG. 5D, a silicon nitride layer 226 is formed on the semiconductor substrate 200 after forming the sidewall oxide layers 222 by oxidation. The silicon nitride layer 226 is formed on sidewall oxide layers 222 of the trenches 205 in the cell region and the NMOS region, and in the PMOS region, the silicon nitride layer 226 is formed on the first device isolation insulating layer 242 and the nitride layer mask 214. The silicon nitride layer 226 functions as a liner nitride film in the cell region and the NMOS region, and functions as an oxidization-resistant layer in the PMOS region when subsequently forming a SOG layer in the trench 205.

Figure 5E:
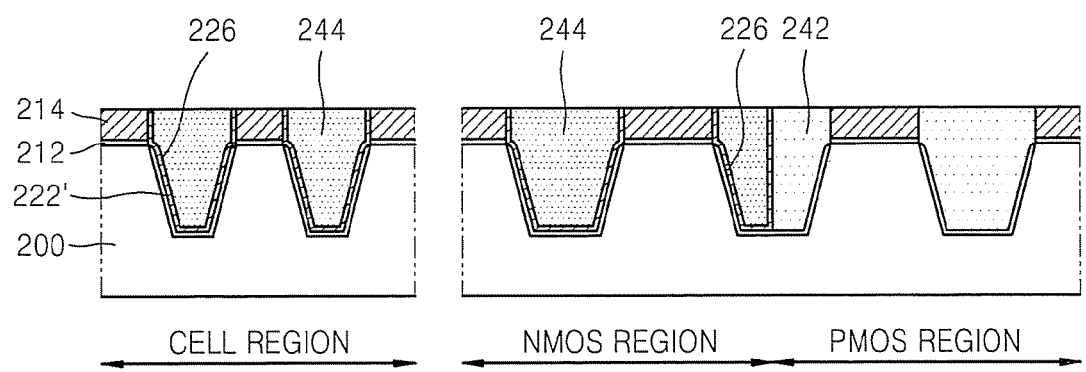

Referring to FIG. 5E, a second device isolation insulating layer 244 is formed to fill the trenches 205 of the cell region and the NMOS region, and is chemical mechanical polished using the nitride layer mask 214 as a stopper layer. The second device isolation insulating layer 244 may be, for example, a SOG oxide layer. Thus, isolation regions are formed in the trench 205 from the second device isolation insulating layer 244 in the cell region and the NMOS region. When annealing the SOG oxide layer, that is, the second device isolation insulating layer 244, in a vapor atmosphere at a high temperature in the cell region and the NMOS region, the silicon nitride layer 226 of the sidewall of the trench 205 may reduce or prevent oxidization of the sidewall of the active region, and in the PMOS region, the silicon nitride layer 226 formed on the first device isolation insulating layer 242 and the nitride layer mask 214 may reduce or prevent oxidization of the sidewall of the active region.

In the illustrated embodiments of the present invention, after trenches for device isolation are formed and before formation of a liner nitride film, trenches of the cell region, the NMOS region, and the PMOS region are filled with an HDP oxide layer or a USG oxide layer. The HDP oxide layer or the USG oxide layer in the cell region and the NMOS region is selectively removed, and a thin silicon nitride layer is formed on the silicon nitride layer. Thus, a device isolation layer is formed on a liner nitride film in the cell region and the NMOS region, and a device isolation layer free of a liner nitride film is formed in the PMOS region.

Figure 6A:
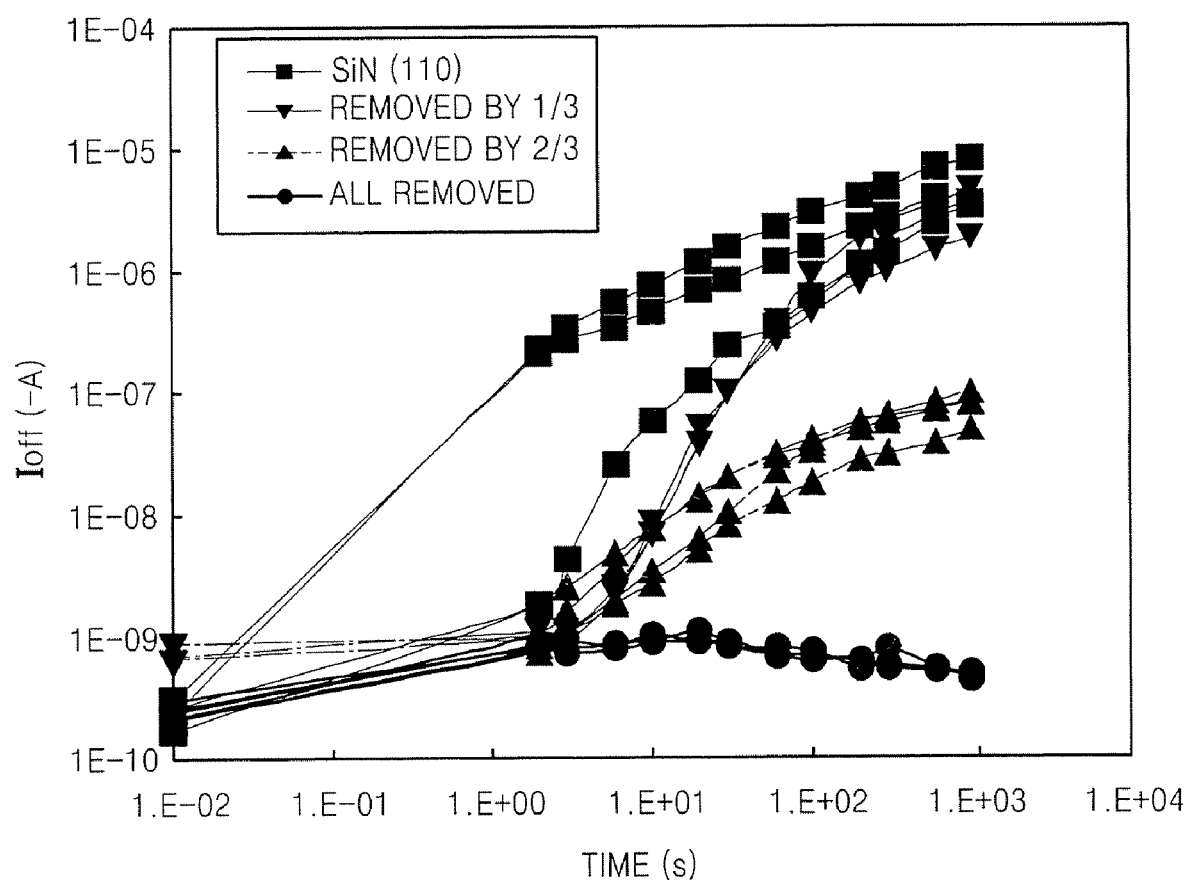
FIG. 6A is a graph showing off currents of a semiconductor device fabricated according to some embodiments of the present invention.

FIG. 6A is a graph of off currents of the semiconductor device versus time of applying electric stress in the semiconductor device, in order to compare the off currents according to the amount of the liner nitride film in the PMOS region. In FIG. 6A, ■ refers to a case including a liner nitride film, ▼ refers to a case where the liner nitride film is removed by ⅓ from an upper portion of the trench, and ▲ refers to a case where the liner nitride film is removed by ⅔ from the upper portion of the trench, and ● refers to a case where the liner nitride film is completely removed.

As apparent from FIG. 6A, for a device isolation layer without a liner nitride film in the PMOS region, few electrons which may be generated by hot carriers are trapped in the boundary between the active region and the device isolation layer and, because there are few trapped electrons, few holes collect at a channel edge of the active region. Accordingly, the increase of off currents which may be caused by holes accumulated at the channel edge is reduced or prevented, thereby improving the reliability of the semiconductor device. As a liner nitride film is formed in the cell region, the refresh characteristics of the cell region may not be degraded and deterioration of the device characteristics due to HEIP can be reduced or prevented.

The liner nitride film of the cell region and the NMOS region may also reduce or prevent compression stress on a channel of the active region by the device isolation layer. It is known that an NMOS device generally has increased speed as the mobility of holes is increased when the NMOS device receives tensile stress. In some embodiments of the present invention, stress can be generated due to the presence of the liner nitride film in the cell region and the NMOS region. Also, the cell region is usually formed of an NMOS device. It is known that a PMOS device has increased device as the mobility of the holes is increased when the channel of the active region receives compression stress, and thereby increasing the on currents.

Figure 6B:
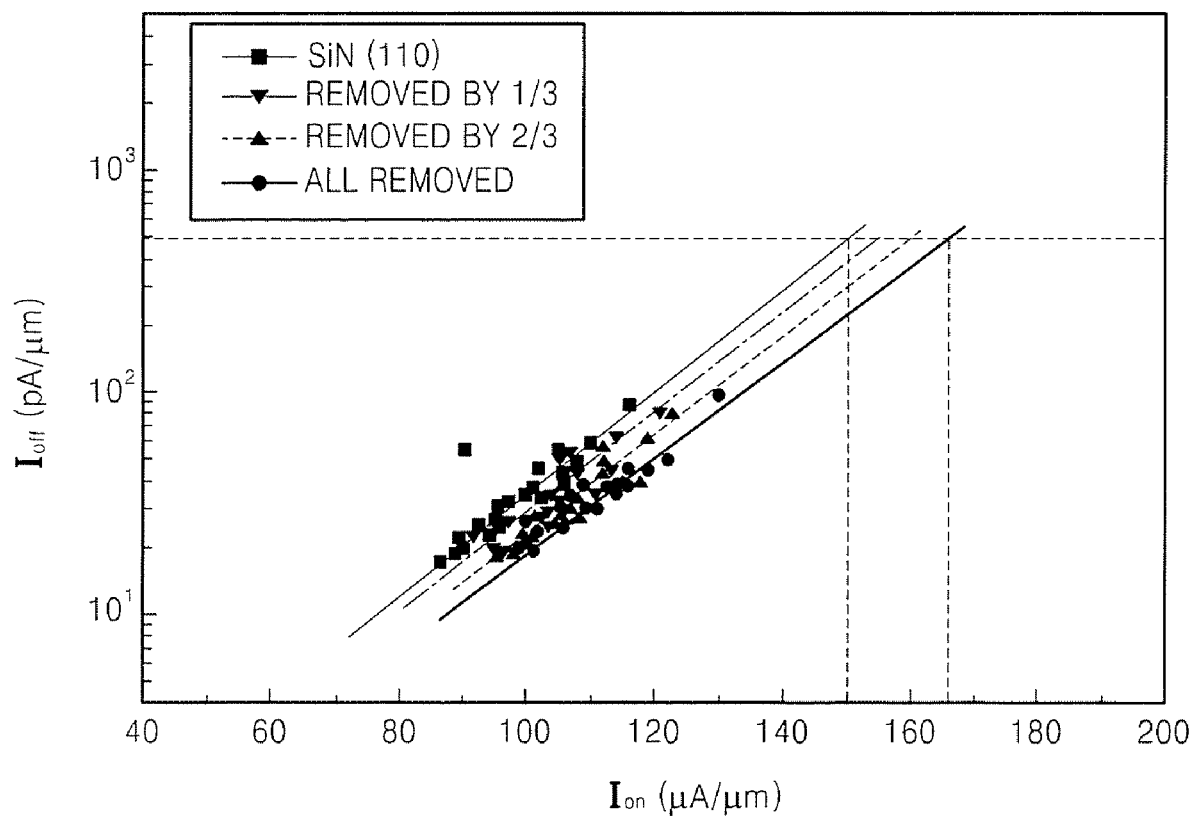
FIG. 6B is a graph of off currents versus on currents for a semiconductor device fabricated according to some embodiments of the present invention.

FIG. 6B is a graph showing off currents versus on currents for comparing the on currents according to the amount of a liner nitride film of a PMOS region. In FIG. 6B, ■ refers to a case including a liner nitride film, ▼ refers to a case where the liner nitride film is removed by ⅓ from an upper portion of the trench, and ▲ refers to a case where the liner nitride film is removed by ⅔ from the upper portion of the trench, and ● refers to a case where the liner nitride film is completely removed. Referring to FIG. 6B, the less silicon nitride layer, the greater the on current, and the on current is greatest when no silicon nitride layer is present. In some embodiments of the present invention, since no liner nitride film is formed, which can prevent compression stress, the PMOS region receives compression stress, and thus the device speed may be increased. Accordingly, in all of the cell region, NMOS region, and the PMOS region, a gain of the on current can be obtained.

In another experiment, when a liner nitride film was inserted in the NMOS region, the on current of the NMOS region was increased due to the increase of tensile stress. Also, the tensile stress of the HDP oxide layer or the USG oxide layer was greater than that of the SOG oxide layer. The on current was greater when the device isolation layer of the PMOS region is formed of an HDP oxide layer than when it was formed of a SOG oxide layer. In the case of the device isolation layer of the NMOS region, the on current of the NMOS region was greater when the device isolation layer was formed of a SOG oxide layer than when it was formed of an HDP oxide layer.

Accordingly, according to embodiments of the present invention, as a liner nitride film can be selectively formed in the cell region and the NMOS region, the HEIP of the PMOS region can be reduced without deteriorating the refresh characteristics of the cell region. Also, by selecting whether to form a liner nitride film or not and selecting the material of the device isolation insulating layer for filling the trench, gain of the on current can be obtained in all of the cell region, the NMOS region, and the PMOS region, by optimum combination of stresses.

What is claimed is:

1. A method of forming a device isolation structure of a semiconductor device, the method comprising:

forming a mask pattern on a semiconductor substrate in which a cell region, a PMOS region, and an NMOS region are defined;

forming respective trenches in the cell region, the PMOS region, and the NMOS region by etching the semiconductor substrate using the mask pattern as a mask;

sequentially forming a sidewall oxide layer and a protection layer in the trenches;

removing the protection layer in the PMOS region;

forming a first device isolation insulating layer on the substrate, filling the trenches;

removing portions of the first device isolation insulating layer to expose the mask pattern and the trenches of the cell region and the NMOS region and leave a portion of the first device isolation insulating layer in the trench in the PMOS region;

forming a silicon nitride layer on the substrate to form an oxidation-resistant layer disposed on the first device isolation insulating layer and the mask pattern in the PMOS region and conforming to sidewalls of the trenches in the cell region and the NMOS region;

forming a second device isolation insulating layer on the substrate, filling the trenches in the cell region and the NMOS region; and removing portions of the second device isolation insulating layer to expose the mask pattern and to leave portions of the second device isolation insulating layer in the trenches of the cell region and the NMOS region.

2. The method of claim 1, wherein the forming of a mask pattern comprises:

forming a pad oxide layer on the semiconductor substrate;

forming a mask silicon nitride layer on the pad oxide layer;

forming a photoresist pattern on the silicon nitride layer; and etching the mask silicon nitride layer using the photoresist pattern as a mask.

3. The method of claim 1, wherein the sidewall oxide layer comprises a thermal oxide layer, a rapid thermal oxidation (RTO) oxide layer or a chemical vapor deposition (CVD) oxide layer.

4. The method of claim 1, wherein the protection layer comprises a silicon layer.

5. The method of claim 4, further comprising oxidizing the silicon layer to form a silicon oxide layer before forming the silicon nitride layer.

6. The method of claim 1, wherein the first device isolation insulating layer comprises a high density plasma (HDP) oxide layer or an undoped silicate glass (USG) oxide layer.

7. The method of claim 1, wherein removing portions of the first device isolation insulating layer to expose the mask pattern and the trenches of the cell region and the NMOS region and leave a portion of the first device isolation insulating layer in the trench in the PMOS region comprises chemically mechanically polishing the first device isolation insulating layer using the mask pattern as a stopper layer.

8. The method of claim 1, wherein removing portions of the first device isolation insulating layer to expose the mask pattern and the trenches of the cell region and the NMOS region and leave a portion of the first device isolation insulating layer in the trench in the PMOS region comprises wet etching to remove portions of the first device isolation insulation layer in the trenches of the cell region and the NMOS region.

9. The method of claim 1, wherein the silicon nitride layer is formed over the sidewall oxide layer in the trenches in the cell region and the NMOS region, and over the mask pattern and the first device isolation insulating layer in the PMOS region.

10. The method of claim 1, wherein removing portions of the second device isolation insulating layer to expose the mask pattern and to leave portions of the second device isolation insulating layer in the trenches of the cell region and the NMOS region comprises chemical mechanical polishing the second device isolation insulating layer using the mask pattern as a stopper layer.

11. The method of claim 1, wherein the second device isolation insulating layer comprises a SOG layer.

12. The method of claim 11, wherein the SOG layer comprises a TOSZ layer.

13. The method of claim 11, wherein forming a second device isolation insulating layer on the substrate, filling the trenches in the cell region and the NMOS region comprises:
   spin-coating a SOG layer;
   baking the spin-coated SOG layer; and
   annealing the baked SOG layer.

14. The method of claim 13, wherein annealing the baked SOG layer is performed in an atmosphere containing $H_2O$.

15. The method of claim 1, further comprising removing the silicon nitride layer to leave the portions of the second device isolation insulating layer in the trenches of the cell region and the NMOS region.

16. A method of forming a device isolation structure of a semiconductor device, the method comprising:
   forming a mask pattern on a semiconductor substrate in which a cell region, a PMOS region, and an NMOS region are defined;
   forming respective trenches in the cell region, the PMOS region, and the NMOS region by etching the semiconductor substrate using the mask pattern as a mask;
   forming a sidewall oxide layer on the trench;
   forming a first device isolation insulating layer on the substrate, filling the trenches;
   removing portions of the first device isolation insulating layer to expose the mask pattern and the trenches of the cell region and the NMOS region and leave a portion of the first device isolation insulating layer in the trench in the PMOS region;
   forming a silicon nitride layer on the substrate to form an oxidation-resistant layer disposed on the first isolation insulating layer and the mask pattern in the PMOS region and conforming to sidewalls of the trenches in the cell region and the NMOS region forming a second device isolation insulating layer on the substrate, filling the trenches in the cell region and the NMOS region;
   removing portions of the second device isolation insulating layer to expose the mask pattern and to leave portions of the second device isolation insulating layer in the trenches of the cell region and the NMOS region; and
   removing the mask pattern.

17. The method of claim 16, wherein the first device isolation insulating layer comprises an HDP oxide layer or a USG oxide layer.

18. The method of claim 16, wherein removing portions of the first device isolation insulating layer comprises anisotropic etching with a high selectivity with respect to the mask pattern.

19. The method of claim 16, wherein the second device isolation insulating layer comprises a SOG layer.

20. The method of claim 19, wherein the SOG layer comprises a TOSZ layer.

* * * * *